(12) United States Patent
Kitai et al.

(10) Patent No.: US 9,257,601 B2
(45) Date of Patent: Feb. 9, 2016

(54) LIGHT EMITTING DIODES AND SUBSTRATES

(75) Inventors: Adrian Kitai, Mississauga (CA); Huaxiang Shen, Hamilton (CA)

(73) Assignee: McMaster University, Hamilton, Ontario (CA)

( * ) Notice: Subject to any disclaimer, the term of this patent is extended or adjusted under 35 U.S.C. 154(b) by 0 days.

(21) Appl. No.: 13/812,058

(22) PCT Filed: May 17, 2012

(86) PCT No.: PCT/CA2012/050326
§ 371 (c)(1),
(2), (4) Date: Jan. 24, 2013

(87) PCT Pub. No.: WO2012/155272
PCT Pub. Date: Nov. 22, 2012

(65) Prior Publication Data
US 2013/0126917 A1    May 23, 2013

Related U.S. Application Data

(60) Provisional application No. 61/486,997, filed on May 17, 2011.

(51) Int. Cl.
| | | |
|---|---|---|
| H05K 1/09 | (2006.01) | |
| H01L 21/283 | (2006.01) | |
| H01L 33/08 | (2010.01) | |
| H01L 33/64 | (2010.01) | |
| H01L 23/36 | (2006.01) | |
| H01L 33/62 | (2010.01) | |
| H01L 23/367 | (2006.01) | |
| H01L 33/20 | (2010.01) | |

(52) U.S. Cl.
CPC .............. *H01L 33/08* (2013.01); *H01L 21/283* (2013.01); *H01L 23/3677* (2013.01); *H01L 33/20* (2013.01); *H01L 33/62* (2013.01); *H01L 33/647* (2013.01); *H05K 1/09* (2013.01)

(58) Field of Classification Search
None
See application file for complete search history.

(56) References Cited

U.S. PATENT DOCUMENTS

| | | |
|---|---|---|
| 4,532,182 A | 7/1985 | Short et al. |
| 4,822,660 A | 4/1989 | Lipp |
| 7,737,356 B2 | 6/2010 | Goldstein |
| 7,910,461 B2 | 3/2011 | Spurgeon et al. |

(Continued)

FOREIGN PATENT DOCUMENTS

| | | |
|---|---|---|
| AU | 2008275878 A1 | 1/2009 |
| AU | 2008275956 A1 | 1/2009 |

(Continued)

OTHER PUBLICATIONS

Feng et al., "Catalytic synthesis and photoluminescence of needle-shaped 3C-SiC nanowires", SolidState Communications vol. 128, pp. 295-297 (2003), Pergamon Press (Elsevier, Ltd.).*

(Continued)

*Primary Examiner* — Johannes P Mondt
(74) *Attorney, Agent, or Firm* — Pepper Hamilton LLP

(57) ABSTRACT

A thin layer substrate has a plurality of micron sized electrically conductive whisker components which are arranged in parallel and extending from one surface of the substrate to another surface to provide electrically conductive paths through the substrate. Such a substrate may be usable for micron sized LEDs.

15 Claims, 9 Drawing Sheets

(56) References Cited

U.S. PATENT DOCUMENTS

| | | |
|---|---|---|
| 8,110,898 B2 | 2/2012 | Lewis et al. |
| 8,222,123 B2 | 7/2012 | Spurgeon et al. |
| 2005/0072458 A1 | 4/2005 | Goldstein |
| 2005/0161662 A1* | 7/2005 | Majumdar et al. ............... 257/18 |
| 2005/0199886 A1* | 9/2005 | Yi et al. ............................ 257/79 |
| 2009/0020150 A1* | 1/2009 | Atwater et al. ............... 136/246 |
| 2009/0020853 A1 | 1/2009 | Kayes et al. |
| 2009/0057839 A1 | 3/2009 | Lewis et al. |
| 2009/0061600 A1* | 3/2009 | Spurgeon et al. ............. 438/478 |
| 2009/0200539 A1 | 8/2009 | Qi |
| 2009/0215208 A1* | 8/2009 | Coe-Sullivan et al. ......... 438/22 |
| 2010/0243050 A1 | 9/2010 | Goldstein |
| 2010/0276664 A1* | 11/2010 | Hersee ............................ 257/15 |
| 2011/0001157 A1* | 1/2011 | McKenzie et al. ............... 257/98 |
| 2011/0095433 A1 | 4/2011 | Horiuchi et al. |
| 2011/0232736 A1 | 9/2011 | Goldstein et al. |
| 2012/0028420 A1 | 2/2012 | Spurgeon et al. |
| 2012/0205614 A1* | 8/2012 | Templier et al. ................... 257/9 |

FOREIGN PATENT DOCUMENTS

| | | |
|---|---|---|
| AU | 2008296763 A1 | 3/2009 |
| AU | 2008296764 A1 | 3/2009 |
| AU | 2009250946 A1 | 1/2010 |
| CN | 101752211 A | 6/2010 |
| CN | 101779271 A | 7/2010 |
| CN | 101796648 A | 8/2010 |
| CN | 101842905 A | 9/2010 |
| CN | 101842909 A | 9/2010 |
| CN | 101971360 A | 2/2011 |
| CN | 102067324 A | 5/2011 |
| EP | 2158612 A2 | 3/2010 |
| EP | 2171745 A2 | 4/2010 |
| EP | 2171761 A2 | 4/2010 |
| EP | 2183788 A1 | 5/2010 |
| EP | 2183789 A1 | 5/2010 |
| EP | 2252448 A2 | 11/2010 |
| EP | 2171761 A4 | 11/2011 |
| JP | 2010533985 A | 10/2010 |
| JP | 2010533986 A | 10/2010 |
| JP | 2010538464 A | 12/2010 |
| JP | 2010541194 A | 12/2010 |
| JP | 2011505062 A | 2/2011 |
| KR | 20100044854 A | 4/2010 |
| KR | 2010067088 A | 6/2010 |
| KR | 2010072220 A | 6/2010 |
| KR | 20100064360 A | 6/2010 |
| MX | 2010005814 A | 10/2010 |
| WO | WO2008/139479 A2 | 11/2008 |
| WO | WO2008/139479 A3 | 11/2008 |
| WO | WO2008/139479 A4 | 11/2008 |
| WO | WO2009/001343 A2 | 12/2008 |
| WO | WO2009/001343 A3 | 12/2008 |
| WO | WO2009/007957 A2 | 1/2009 |
| WO | WO2009/007957 A3 | 1/2009 |
| WO | WO2009/012459 A2 | 1/2009 |
| WO | WO2009/012459 A3 | 1/2009 |
| WO | WO2009/012469 A2 | 1/2009 |
| WO | WO2009/012469 A3 | 1/2009 |
| WO | WO2009/027977 A2 | 3/2009 |
| WO | WO2009/027977 A3 | 3/2009 |
| WO | WO2009/027977 A4 | 3/2009 |
| WO | WO2009/032412 A1 | 3/2009 |
| WO | WO2009/032413 A1 | 3/2009 |
| WO | WO2009/069129 A2 | 6/2009 |
| WO | WO2009/069129 A3 | 6/2009 |
| WO | 2011048318 A1 | 4/2011 |
| WO | WO-2011048318 * | 4/2011 .............. H01L 27/15 |

OTHER PUBLICATIONS

International Search Report and Written Opinion for PCT/CA2012/050326 dated Oct. 1, 2012.

Quan et al., Investigation of whisker orientation in SIC whisker-reinforced alumina composites using neutron diffraction, *Journal of the European Ceramic Society* (2007), 27(1):389-396 (Abstract).

Shen, The Manipulation and Alignment of Silicon Carbide Whiskers for GaN Expitaxial Growth, pp. 1-12.

* cited by examiner

LIGHT EMITTING DIODES AND SUBSTRATES

CROSS-REFERENCE TO RELATED APPLICATIONS

This application is a U.S. national stage filing under 35 U.S.C. §371 of International Application No. PCT/CA2012/050326, filed on May 17, 2012, entitled "Light Emitting Diodes and Substrates," which in turn claims priority under 35 U.S.C. 119(e) as a non-provisional filing of U.S. Provisional Patent Application Ser. No. 61/486,997, filed on May 17, 2011, entitled "Micron Sized LEDs Supported by Alumina Ceramics," the disclosures of which are incorporated by reference in their entireties.

BACKGROUND

Light emitting diodes, or LEDs, are being used in an ever-growing number of ways, and the size of LEDs is becoming smaller to accommodate larger numbers of diodes in less space. A diode is the simplest sort of semiconductor device and includes an arrangement of an electron rich (N-type) material in electrical contact with a hole rich (P-type) material. When current flows across a diode, negative electrons move one way and positive holes move the other way. When an electron encounters and 'falls into' a hole it loses energy, and the energy is emitted as a light photon. LEDs output more lumens of light per-watt than regular incandescent bulbs, and some LEDs may have a lifetime of 50,000 hours or more.

Nitride semi-conductors are a desirable semiconductor material system for light-emitting devices operating in the green-blue-ultraviolet spectrum. Presently, nitride semiconductor structures grown on sapphire substrates are used for conventional blue LED, green LED, ultraviolet (UV) LED, and blue laser diode (LD) devices. These devices may be usable in a variety of applications including full-color displays, traffic lights, image scanners, solid state lighting and high-density optical storage disks. However, nitride semiconductors are difficult and costly to produce as bulk single crystals. For this reason, hetero-epitaxial technology is often used to grow nitride semiconductors on different material substrates such as sapphire. In order to improve the crystalline quality of the grown layers, buffer layer growth at low temperature, patterning, epitaxial lateral overgrowth, or additional growth steps may be required to reduce crystal defects to levels necessary for operation of light-emitting devices. Further improvements in crystalline quality are needed to enable development of smaller light-emitting devices with longer life time, higher output power, and lower cost relative to conventional devices.

Because sapphire has a low thermal conductivity and is electrically insulating, the functionality of nitride semiconductor structures on sapphire is limited. Both electrical contacts of a light-emitting device grown on a sapphire substrate are located on the top surface to form a lateral type device. This reduces the usable area of light-emission. Because both contacts are located on the top surface in a lateral device, significant lateral current flows through the chip resulting in heating of the light-emitting device which accelerates the degradation of the device. In addition, the coefficient of thermal expansion of sapphire is also poorly matched to nitrides and its alloys. As a result, the growth of nitride-based films on sapphire substrates presents challenges that scale with wafer diameter. Because of these challenges, manufacturers have found it difficult to provide larger substrate sizes despite the potential for associated cost reductions.

It therefore remains desirable to provide alternative substrates for semiconductor devices, and to reduce the cost of semiconductor diodes, such as LEDs, while decreasing the size of the diodes and producing more diodes per unit space.

SUMMARY

Presently disclosed are substrates, methods for making the substrates, semiconductor diodes made with the substrates, and various methods of use. The substrates may include an array of substantially parallel micron-sized whiskers which are able to provide multiple current paths from one face of the substrate to the other. Each of these paths may thereby provide a separate contact for microelectronic systems, such as semiconductor diodes.

In an embodiment, a substrate includes a matrix material and a plurality of spaced apart and substantially parallel electrically conductive whisker components embedded in the matrix material and extending longitudinally between a first surface of the substrate and an opposing second surface of the substrate.

In an embodiment, a method for producing an array of semiconductor diodes includes forming a substrate for the diodes. The forming of the substrate includes forming a matrix of a plurality of spaced apart and substantially parallel electrically conductive whisker components in a matrix material with the whisker components extending longitudinally between a first surface of the matrix and an opposing second surface of the matrix and having a first end face exposed in the first surface and a second end face exposed in the second surface, and polishing at least the first surface of the matrix to provide polished first end faces of the whisker components for crystal growth thereon. The method also includes growing at least one layer of a semiconductor on the first surface epitaxial with the exposed first end faces of the whisker components, depositing a first electrical contact layer on the semiconductor layer for providing a first electrical contact with the semiconductor layer, and depositing a second electrical contact layer on the second surface of the matrix in contact with the second end faces of the whisker components for providing a second electrical contact with the semiconductor layer via the substantially parallel whisker components.

In an embodiment, a substrate includes a matrix of a plurality of spaced apart and substantially parallel electrically conductive whisker components extending longitudinally between a first surface of the substrate and an opposing second surface of the substrate, and the substrate is produced by a method that includes forming the matrix of the plurality of spaced apart and substantially parallel whisker components in a matrix material, and curing the matrix material to form the substrate.

In an embodiment, a method for producing a substrate for micro-electronic systems includes forming a refractory matrix. The refractory matrix includes a plurality of spaced apart and substantially parallel electrically conductive whisker components in a refractory material, wherein the whisker components extend longitudinally between a first surface of the material and an opposing second surface of the material and have a first end face exposed in the first surface and a second end face exposed in the second surface. The method also includes sintering the refractory material to fix the whisker components in the refractory material. Refractory materials can include sinterable ceramics. In some cases, sinterable ceramics are stable at temperatures equal to or greater than about 1,000° C. The sinterable ceramics may also have a vapor pressure of less than about 1 mm Hg at about 1,000° C.

In an embodiment, a semiconductor diode array includes at least one first whisker component comprising an electrically conductive material, at least one second whisker component comprising an electrically conductive material and disposed spaced apart from and substantially parallel to the first whisker component, with each whisker component having a first end face, a second end face and a longitudinal dimension extending from the first end face to the second end face. The array additionally includes an electrically insulating material disposed between and retaining the first whisker component and the second whisker component and encasing at least a portion of the whisker components, the electrical insulating material having a first surface with the first end faces of the whisker components exposed in the first surface, and a second surface opposite the first surface with the second end faces of the whisker components exposed in the second surface, and an electroluminescent material disposed on the first end faces.

A semiconductor diode sheet includes a plurality of silicon carbide whisker components spaced apart from one another and in substantial parallel alignment in a substrate, wherein the substrate comprises a matrix material, the substrate sheet has a first surface and a second surface opposite the first surface, the whisker components have a first end face in the first surface of the substrate sheet and a second end face in the second surface of the substrate sheet. The sheet also includes at least one layer of a III-nitride semiconductor disposed on the first surface epitaxial with the first end faces, a first electrical contact layer on the III-nitride layer for providing a first electrical contact with the III-nitride layer, and a second electrical contact layer on the second surface of the substrate sheet in contact with the second end faces of the whiskers for providing a second electrical contact with the III-nitride layer via the whisker components.

DETAILED DESCRIPTION

Figure 1A:
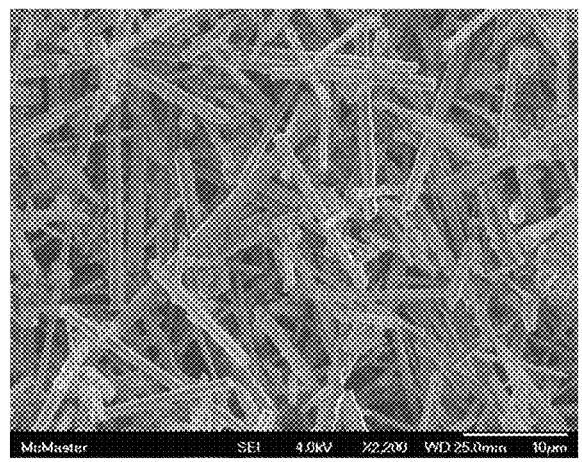
FIGS. 1A-1C are scanning electron microscope images of (111) oriented beta-silicon carbide whiskers which may be used in an embodiment.

Semiconductor diodes (semiconductor p-n junction diodes) include the light-emitting diode (LED) and its companion, the laser diode (LD). Originally restricted to the color red, the next colors to become commercially available with light-emission efficiencies superior to incandescent lamps were yellow, orange, and amber LEDs. The push to extend operation into the short wavelength region of the visible spectrum (from green to violet) has been more challenging.

Attempts to make LEDs and LDs with silicon carbide (SiC) and II-VI materials (e.g., ZnSe) have been made, but the utility of such devices has been diminished by the very low efficiency in SiC diodes and the short device lifetimes in the II-VI materials due to the relative ease of defect formation. As a result, the III-V nitride materials with the wurtzite crystal structure (GaN, AlN, InN, and their alloys) have become the focus of interest for these wavelengths. Since the electronic band structure for each of the nitride materials possesses a direct transition with a band gap energy ranging from about 1.9 eV for InN, to about 3.4 eV for GaN, to about 6.2 eV for AlN at room temperature, as well as a fairly high thermal conductivity, the GaN and (AlIn)GaN systems are being explored in the areas of high-power and high-temperature electronic devices and short-wavelength (visible and ultraviolet) optoelectronic devices.

With no suitable bulk-crystal technology for producing GaN substrates, epitaxy was typically used on highly lattice- and thermal-expansion-mismatched substrates such as silicon, gallium arsenide, and sapphire. The resulting heteroepitaxial films were invariably highly defected with ~$10^{10}$ dislocations/$cm^2$ and highly conducting as a result of defects and impurities. The films also exhibited poor surface morphology as a result of a non-optimized growth approach. The high n-type background, coupled with the relatively deep ionization levels of common p-type impurities, resulted in an inability to grow p-type material and prevented the development of bipolar and injection-type devices. Despite these problems, the fabrication of metal-insulator-semiconductor LEDs was achieved, thus demonstrating the potential for this material system.

The use of thin, low-temperature AlN, and later, GaN buffer layers facilitated the growth of high-quality GaN films, specular and free of cracks, on sapphire substrates by metalorganic chemical vapor deposition (MOCVD) and this led the way to the first GaN electroluminescent devices based on a p-n junction. A GaN-based LED material, or die, may be made by growing GaN on single crystal substrates of preferably sapphire ($Al_2O_3$) or silicon carbide (SiC). A single crystal or monocrystalline solid is a material in which the crystal lattice of the entire sample is continuous and unbroken to the edges of the sample, with no grain boundaries and essentially having an absence of defects associated with grain boundaries.

Sapphire and silicon carbide substrates may be prepared by growing single crystal boules of $Al_2O_3$ or SiC and then dicing the boule into wafers. Each wafer then can be polished. After the growth of the GaN-based materials and associated layers onto the substrate, finished LED dies are prepared by dicing the substrate into small pieces. Each die may then be tested and incorporated into a contacted package forming a finished LED. It is costly to prepare semiconductor diodes in this manner for applications where thousands or millions of the diodes may be needed to form pixels in a small area device such as a flat panel display.

As presently described, an alternative to wafers cut from single crystal boules may be provided by semiconductor thin films deposited on a micron size cross section of electrically conductive whiskers that are embedded in a substrate material. The whiskers may be of a material which is able to provide a surface for epitaxial growth of a semiconductor thereon. Some examples of such whisker materials may include silicon carbide, or silicon. One embodiment provides a substrate having aligned micron size whiskers embedded in a support matrix material. An exemplary substrate may have micron size silicon carbide single crystal whiskers in substantial parallel alignment in a refractory ceramic matrix. The ceramic may be an alumina ceramic matrix and the substrate may be usable for a III-nitride thin film to be deposited thereon for the production of semiconductor diodes, such as LEDs. Some examples of LED layers which may be deposited on the substrate may include III-nitride layers, n-doped III-nitride layers, p-doped III-nitride layers, quantum well layers, light emitting layers, cladding layers and combinations thereof sufficient to provide working LEDs. In an embodiment, the substrate may be flexible and the matrix material may be a flexible ceramic or polymer.

Figure 1B:
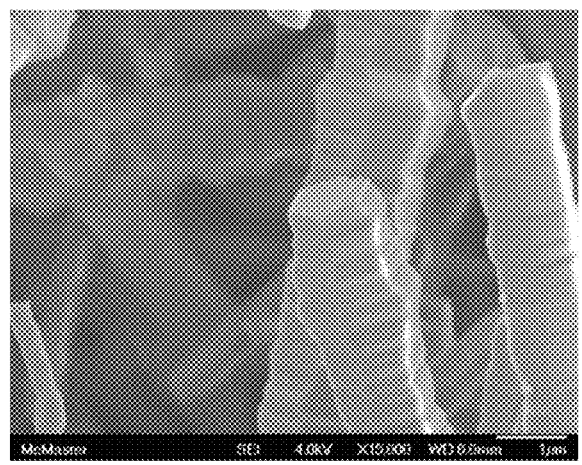
Figure 1C:
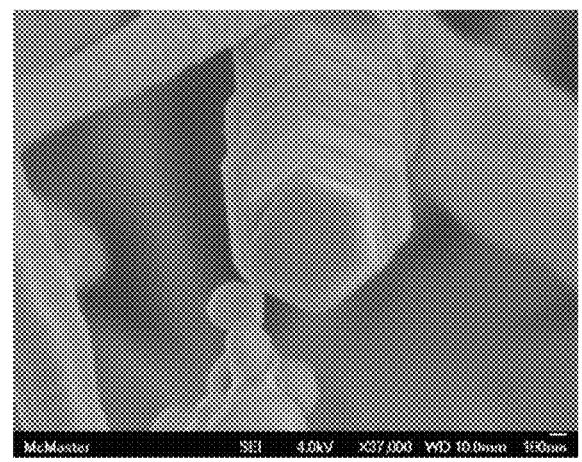

FIGS. 1A-1C show scanning electron microscope images of (111) oriented cubic phase single crystal beta-SiC whiskers. One type of such whiskers may be obtained from Alpha Aesar (Ward Hill, Mass.). SiC whiskers may be formed from rice hulls in a low-cost process in which carbon is introduced at high temperatures to react with the high silicon content of the rice hulls. The whiskers have an average approximate diameter of about 1 µm to about 3 µm, and average approximate lengths of 18 µm.

SiC whiskers are beta-phase single crystalline and may be oriented to allow the (111) plane (the plane normal to the whisker axis) to be available as a growth plane. The (111) plane of SiC whiskers has essentially the same lattice constant as the (001) plane of either 4H or 6H SiC, such as may be synthetically grown as a boule. Therefore SiC whiskers can essentially provide the same nucleation condition as that of 4H or 6H SiC for III-nitride epitaxial growth, but at much lower price than that of 4H or 6H SiC wafers. In an embodiment, the (111) plane of SiC whiskers may thereby provide a crystallization site for epitaxial growth of GaN based layers that may be component layers of some types of semiconductor diodes.

Figure 2A:
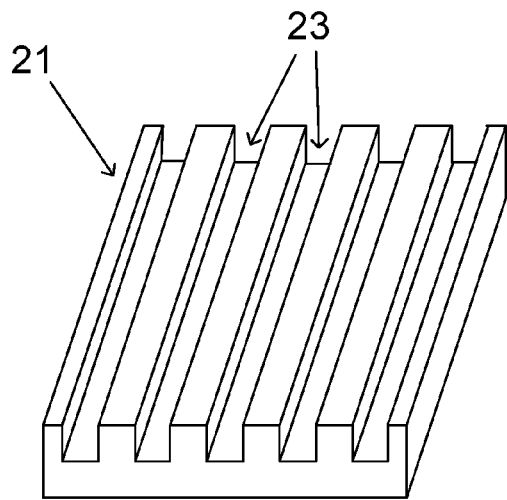
FIGS. 2A-2B depict examples of grooved surfaces which may be used for alignment of whiskers according to an embodiment.
Figure 2B:
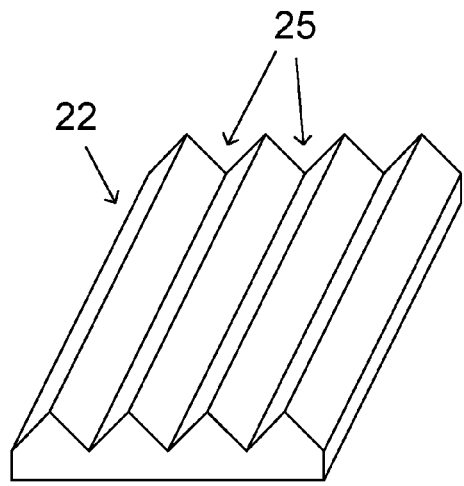
Figure 3:
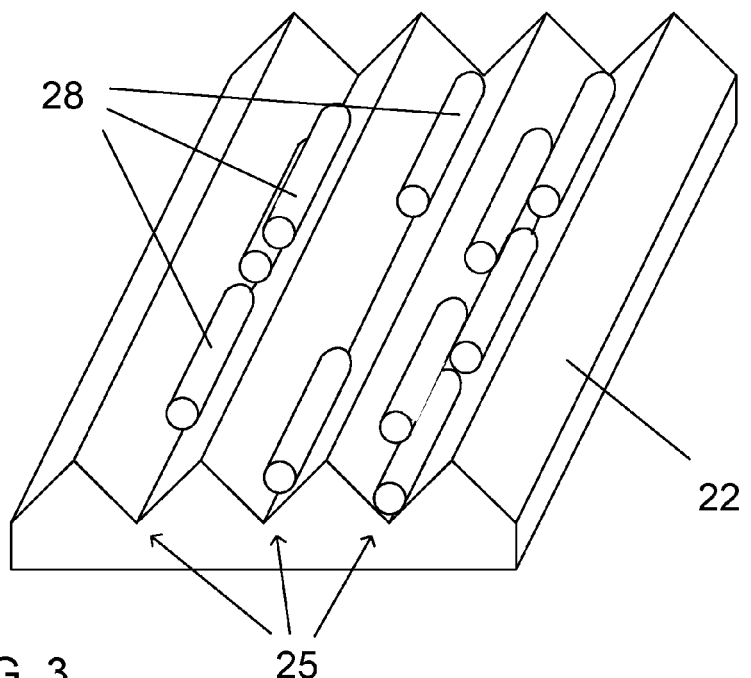
FIG. 3 depicts whiskers deposited on, and aligned in, surface grooves according to an embodiment.

In order to provide an arrayed alignment of the whiskers in accordance with an embodiment, a base component, such as the components 21, 22 depicted in FIGS. 2A and 2B, having a template surface with a plurality of substantially aligned grooves 23, 25 may be used. The grooves 23, 25 may be parallel grooves. As shown in FIG. 3, whiskers 28 may settle into the grooves 25 and essentially align themselves in parallel with others of the whiskers. The whiskers 28 may be applied to the surface of the components 21, 22 as an aqueous solution, whereby the whiskers may then settle out of the solution onto the surface. Alternatively, the whiskers 28 may be sprinkled over the surface and the components 21, 22 may be agitated to cause the whiskers to fall into alignment in the grooves 23, 25.

The grooved base components 21, 22 may be any type of material which is capable of being grooved or molded to contain grooves. The grooved components 21, 22 may be molded plastic sheets, molded ceramics, or any type of material that may be etched to groove the surface, such as glass, or a silicon wafer. Some examples of pre-formed components include diffraction gratings and brightness enhancing films which may resemble the example as depicted in FIG. 2B. One type of brightness enhancing film which may be usable in an embodiment are the Vikuiti™ films manufactured by 3M, which have a groove spacing of either 24 µm (about 41 grooves/mm) or 50 µm (about 20 grooves/mm). The disclosed materials are meant as examples only and the types of materials that may be used to provide the grooved components 21, 22 is not limited to those disclosed herein. The number of grooves per millimeter in the surface may range from about 100 grooves/mm to about 10 grooves/mm. In an embodiment, the number of grooves per millimeter may be about 10 grooves/mm. In an embodiment there may be about 20 grooves/mm. In an embodiment there may be about 30 grooves/mm. In an embodiment there may be about 40 grooves/mm. In an embodiment there may be about 50 grooves/mm. In an embodiment there may be about 60 grooves/mm. In an embodiment there may be about 70 grooves/mm. In an embodiment there may be about 80 grooves/mm. In an embodiment there may be about 90 grooves/mm. In an embodiment there may be about 100 grooves/mm. Other embodiments may have a groove density of a value between any two of the listed values, or any other suitable density of grooves per millimeter. Selection of the number of grooves may be dependent on the final desired use of the whisker array and the number of whiskers needed.

Figure 4:
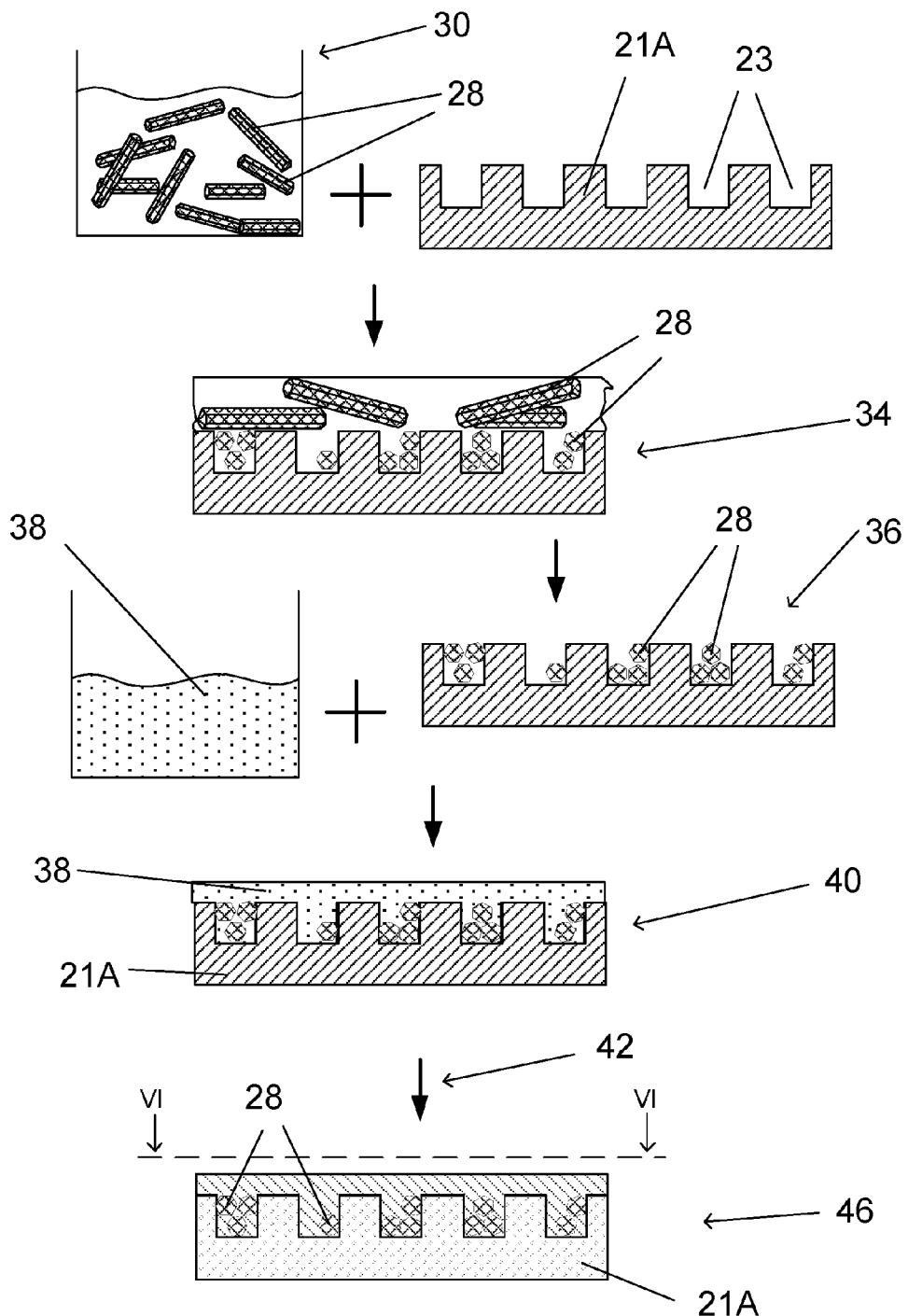
FIG. 4 is a schematic representation of a method for forming a substrate according to an embodiment.

In an embodiment, the grooved component 21A may be a ceramic, such as for example, alumina, zirconia, alumina with SiC whiskers or zirconia with SiC whiskers. In an embodiment as depicted in FIG. 4, whiskers 28 may be suspended in a liquid to form a mixture 30. The liquid may be water, or any other suitable liquid which does not affect the structural integrity the whiskers 28, such as, for example, an alcohol such as ethanol or methanol, or a diol such as ethanediol. The liquid may also contain a suitable surfactant to inhibit agglomeration of the whiskers 28. Some examples of surfactants include, but are not limited to, polycarboxylic acids, polyethyleneimine, fatty alcohols, polyoxymethylene glycol, glucoside alkyl ethers and alkyl sulfates. In an embodiment SiC whiskers may be well dispersed in a mixture containing ethanol (25%), ethanediol (75%), and polyethylene (1%) by volume.

The mixture 30 may be deposited on the surface of the grooved component 21A to cover the surface and form a first intermediate stage 34 wherein some of the whiskers 28 may settle into the grooves 23 while others of the whiskers may settle at angles to the grooves and remain above the grooves. In an embodiment, the components 21A may be agitated to shake additional ones of the whiskers 28 into the grooves 23. Excess liquid and whiskers 28 which do not settle into the grooves 23 may be wiped away, such as with a squeegee for example, in a direction which will not dislodge whiskers from the grooves, which may be at an angle of about 45° to the longitudinal direction of the grooves. Additional liquid may then be allowed to evaporate from the surface thereby forming a second intermediate stage 36 of whiskers 28 settled within the grooves 23.

Figure 5:
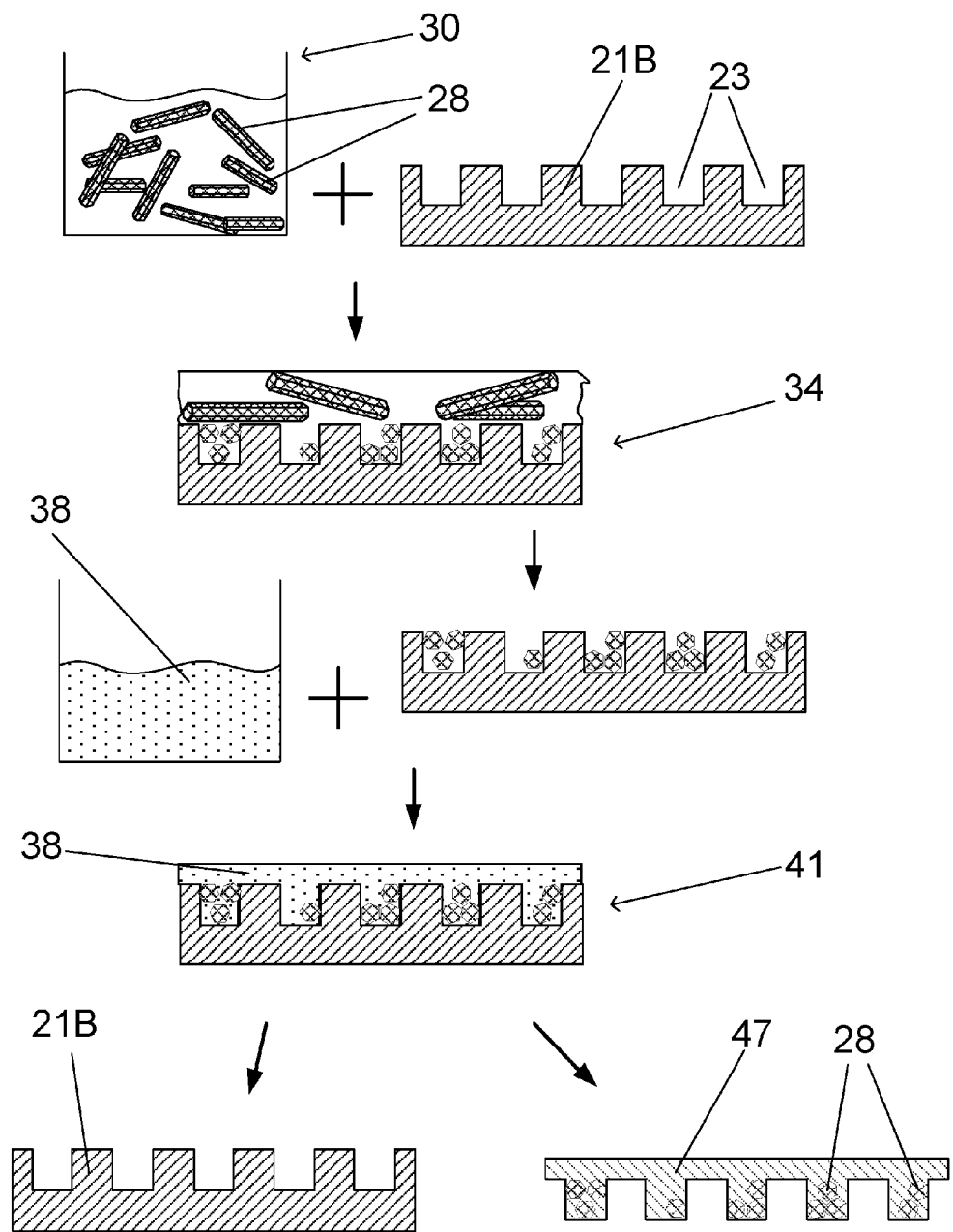
FIG. 5 is a schematic representation of an alternative method for forming a substrate according to an embodiment.

As depicted in FIGS. 4 and 5, once the whiskers 28 have settled into the grooves 23, 25, the whiskers may be fixed in position by entrapping them in a substance which may be poured over them to solidify and retain the whiskers therein. After the liquid has substantially evaporated from the surface, a retaining material 38 may be poured over the grooves 23 and whiskers 28. Dependent on the desired final use for whisker substrate 46, the retaining material may essentially be any type of material which is able to enter into the grooves 23 and solidify to retain the whiskers in a fixed position with respect to one another. In an embodiment, the material 38 may be an electrically insulating material. Some examples of the material 38 may include, and are not limited to, polymers, epoxies and ceramics which may be poured over the whiskers and allowed to solidify to retain the whiskers in the solidified material. Some examples of polymers may include polyimides and polysulfones.

In an embodiment, the material 38 may be a powder or slurry of a ceramic which may be poured over the whiskers 28 to at least partially envelop the whiskers to provide a third intermediate stage 40. The ceramic may then be hardened by a processing step, or steps 42, which may include allowing the slurry 38 to dry by evaporating the liquid component from the slurry. The drying may be enhanced with heat, microwaves, or other similar techniques which may be able to provide a drying of the material. The ceramic 38 may be compressed with the base component 21A at a pressure which is sufficient to compact and hold the powder together. Such a pressure may be equal to or greater than about 10 MPa. The ceramic may then be sintered to form a solid ceramic matrix 46 of whiskers 28. The sintering can be performed at a variety of temperatures, such as at least about ⅔ of the melting temperature of the ceramic and less than the melting temperature of the ceramic. The sintering can be performed for a sufficient period of time to bond the ceramic together. The matrix 46 may be in the form of a pellet, or rod, and may be an ingot from which multiple thin layers of substrate may be cut.

FIG. 5 depicts a process which is similar to that as described with reference to FIG. 4 but an embodiment wherein the grooved component 21B may be a removable mold. A mixture 30 of whiskers 28 may be poured over the surface and the whiskers allowed to settle into the grooves 23. The ceramic slurry 38, or other material capable of solidifying around the whiskers 28, may be poured over the whiskers to form the composition 41 of ceramic and whiskers on the grooved base 21B. In an embodiment, after the ceramic has at least partially dried and attained a sufficient stage of solidification, pressure and sintering may be applied if the base component 21B is able to withstand the sintering temperature. The base component 21B may be separated from the formed ceramic layer 47 with the whiskers 28 embedded therein. In an embodiment, additional hardening, or sintering may be applied after separation.

In an embodiment, the slurry 38 may be an aqueous alumina slurry of about 33.3 wt % alumina powder, about 6.7 wt % PVA binder, about 4.2 wt % glycerol plasticizer and about 0.8 wt % $NH_4PMA$ dispersant in about 55.0 wt % water. In an alternate embodiment, the slurry 38 may be an alcohol-alumina slurry of about 63.53 wt % alumina powder ($d_{50}$—0.35 µm), about 4.7 wt % poly(vinylbutyral) binder, about 4.45 wt % butylbenzylphthalate plasticizer and about 1.27 wt % Menhaden Fishoil dispersant in about 26.05 wt % toluol/ethanol (azeotropic mixture).

In an alternative embodiment, the matrix material 38 may be a material which is able to support the whiskers 28 during processing, but which may then subsequently be replaced later with a polymer, resulting in a flexible sheet containing the whiskers. Such a polymer sheet may be usable, for example as a flexible display screen such as a TV screen. In an embodiment, the matrix material may be carbon, which would be able to withstand the higher temperatures needed for epitaxial growth, but which may then be removed, for example, by oxidation or other methods, and may be replaced by a flexible polymer.

Figure 6:
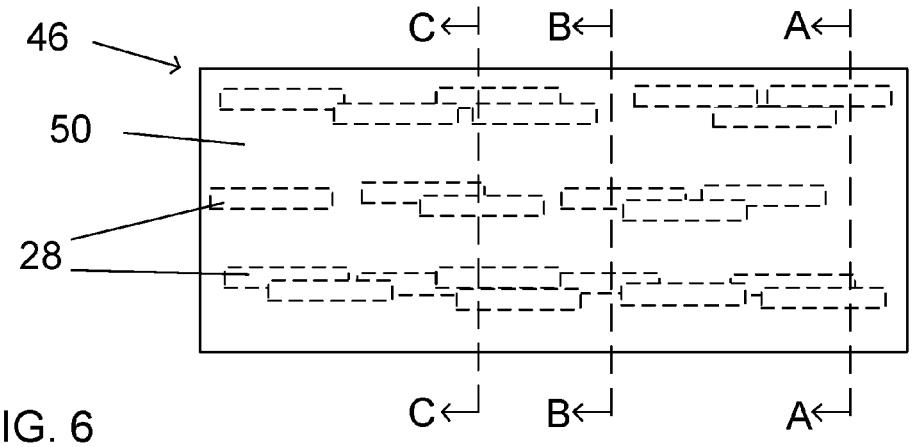
FIG. 6 is a representative illustration of a substrate ingot according to an embodiment.
Figure 7:
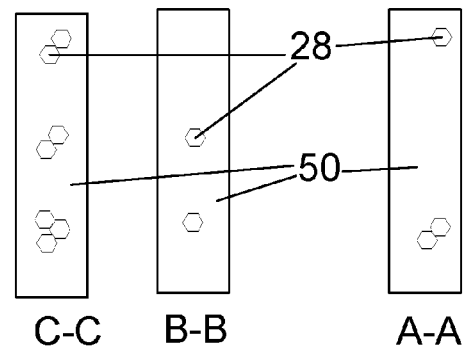
FIG. 7 depicts representative cross-sectional views of the substrate ingot of FIG. 6 according to an embodiment.

FIG. 6 depicts a representative overhead view of a substrate ingot 46 taken along the line VI-VI in FIG. 4, and shows an illustration of how whiskers 28 may be aligned and retained in the ceramic substrate 50. Three rows of whiskers 28 are shown in a manner in which they may have settled into the grooves 23 of the grooved base component 21A. FIG. 7 depicts several cross-sectional views of the substrate ingot 46 of FIG. 6 taken along the lines A-A, B-B and C-C in planes normal to the whisker direction. As depicted in FIGS. 6 and 7, because of the random distribution of whiskers 28 in the dispersion mixture 30 (FIG. 4) and random settling into the grooves 23, the distribution of whiskers 28 in the ceramic 50 may also be random, with overlapping whiskers in some areas as shown primarily in section C-C, and/or possibly also no whiskers at all as depicted in the upper portion of section B-B or the central portion of section A-A.

Figure 8:
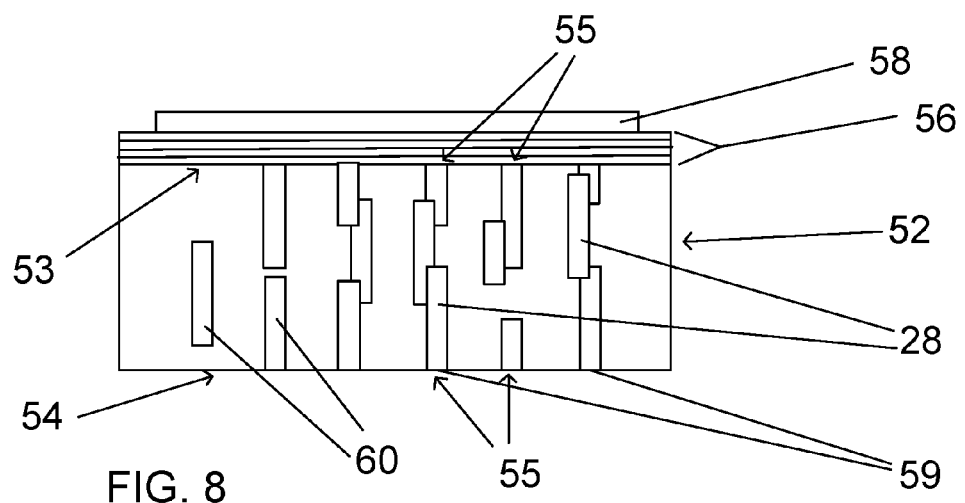
FIG. 8 is a representative illustration of an LED array formed on a substrate layer according to an embodiment.

The substrate ingot 46 may be processed for further applications. In an embodiment, the substrate may be cut into thin layers 52 along the plane normal to the whisker direction, as shown in FIG. 8. Such layers may be at least about 20 µm thick. Alternatively, the layers may be about 30 µm, or about 40 µm, or about 50 µm, or about 60 µm, or about 70 µm, or about 80 µm, or about 90 µm, or about 100 µm, or any thickness between any of the listed thickness values, or any thickness sufficient for which the substrate is to be used. One or both of the top surface 53 and the bottom surface 54 may be polished with, for example, a diamond based polish, to smooth the surfaces and provide exposed approximately circular whisker cross-sections in the polished planes. The surfaces 53, 54 may resemble the cross-sections as depicted in FIG. 7 and may have a large number of micron sized whisker cross-sections exposed on the surfaces.

Figure 9:
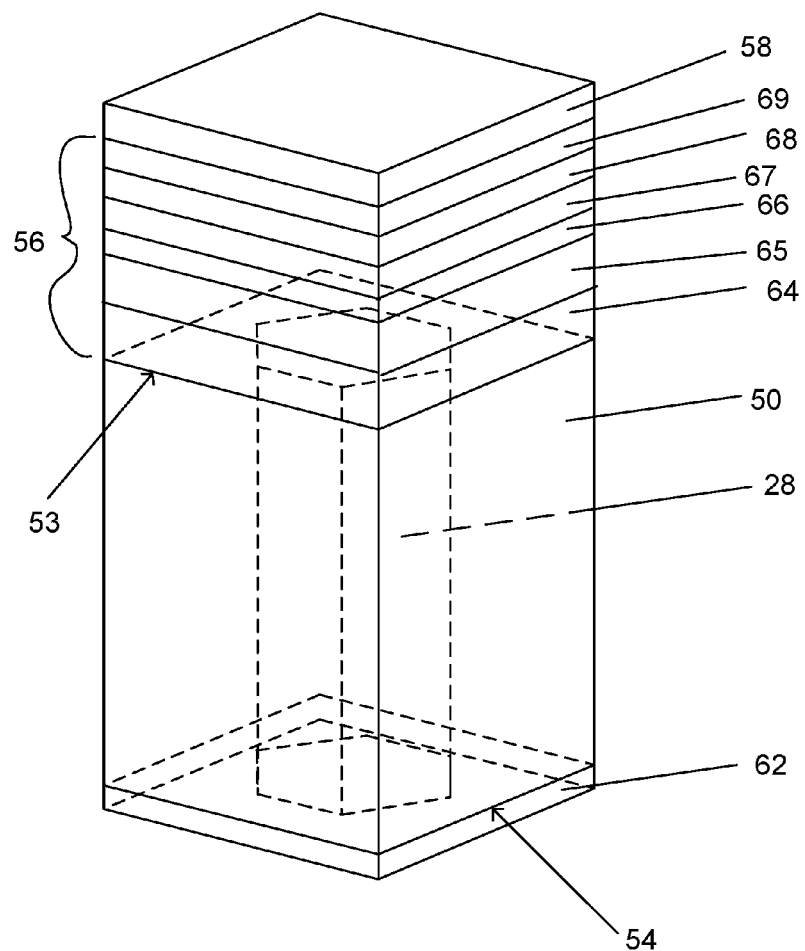
FIG. 9 depicts a perspective view of a representative LED pixel in accordance with an embodiment.

The thin layers 52 may be used as substrate layers for the formation of microelectronic systems thereon. Some exemplary systems may include LEDs, and LDs. FIG. 8 depicts a sectional view of the general layers of an LED. In an embodiment in which SiC whiskers are embedded in a ceramic, the orientation of the whiskers 28 normal to the surfaces 53, 54, exposes the (111) oriented faces 55 of the whiskers for epitaxial growth of semiconductor layers thereon. In an embodiment, in which the whiskers 28 are electrically conductive (SiC whiskers), the aligned whiskers may provide electrical current paths through the substrate layer 52. Each exposed whisker 28 may then possibly constitute a potential working LED once the necessary LED layers 56 and electrical contacts 58, 59 are formed on the surfaces 53, 54. An embodiment of a single-whisker LED is depicted in FIG. 9. Each LED may have an active working area corresponding to the diameter of the whiskers 28, which for SiC whiskers is about 1 µm to about 3 µm. The exposed whisker faces 55 in the bottom surface 54 may provide one of the electrical contacts. Alternatively, as shown in FIG. 9 a bottom contact layer 62 may be provided on the bottom surface 54. Because of the random deposition as discussed previously, some of the potential electrical paths may be incomplete as shown by the two left-side whisker columns 60 in FIG. 8.

The use of a refractory ceramic as the substrate material 50 for retaining the whiskers 28 provides good mechanical support and allows for the high temperature (at least about 900° C.) epitaxial growth of GaN-based LED layers. Some examples of GaN-based layers used in making LEDs include, but are not limited to, GaN, AlGaN, AlN, GaInN, AlGaInN, InN, GaInAsN, GaInPN, or combinations thereof. In an embodiment as depicted in FIG. 9, the LED layers may include a GaN underlying layer 64, an n-type GaN layer 65, an n-type AlGaN clad layer 66, a light-emitting layer 67 made of InGaN, a p-type AlGaN clad layer 68, and a p-type GaN contact layer 69, each sequentially formed on the top surface 53 of the substrate layer. In further embodiments, other types and arrangements of LED layers may be provided on the substrate 50 dependent on the type of LED being produced. Similar types and arrangements of LD layers, including n-type layers and p-type layers may also be grown or deposited on a substrate 50.

The whiskers 28 embedded in the substrate 50 may provide the electrical contact to the bottom of the LED layers. The top and bottom contact layers 58 and 62 may be formed from a metal or any other type of conducting material, such as a conducting polymer, or a zinc or tin oxide, some examples of which may include, but are not limited to, organically modified ceramic, polyaniline, Mg/Ag, In, Ag, Pt, Au, or combinations thereof. Although not shown, a phosphor coating may be applied in the vicinity of the light emitting layer 67 to produce a desire white light.

Methods of growing the semiconductor layers may include any of a variety of technologies. Some exemplary methods may include, but are not limited to, an MOCVD (metal organic chemical vapor deposition) method, an HVPE (hydride vapor phase epitaxy) method, or an MBE (molecular beam epitaxy) method. The MOCVD method may in some cases provide better control of the thickness of a layer and more re-producible mass production.

In the MOCVD method, hydrogen ($H_2$) or nitrogen ($N_2$) may be used as a carrier gas, trimethylgallium (TMG) or triethylgallium (TEG) may be used as a Ga source, which is a group-III element, trimethylaluminum (TMA) or triethyl aluminum (TEA) may be used as an Al source, trimethylindium (TMI) or triethylindium (TEI) may be used as an In source, and ammonium ($NH_3$) or hydrazine ($N_2H_4$) may be used as a nitrogen (N) source, which is a group-V element. In addition, for example, Si-based materials, such as monosilane ($SiH_4$) and disilane ($Si_2H_6$), and Ge-based materials, such as germane ($GeH_4$), may be used as n-type dopants, and Mg-based materials, such as bis-cyclopentadienylmagnesium ($Cp_2Mg$) and bisethylcyclopentadienyl magnesium ($EtCp_2Mg$), may be used as p-type dopants.

Figure 10:
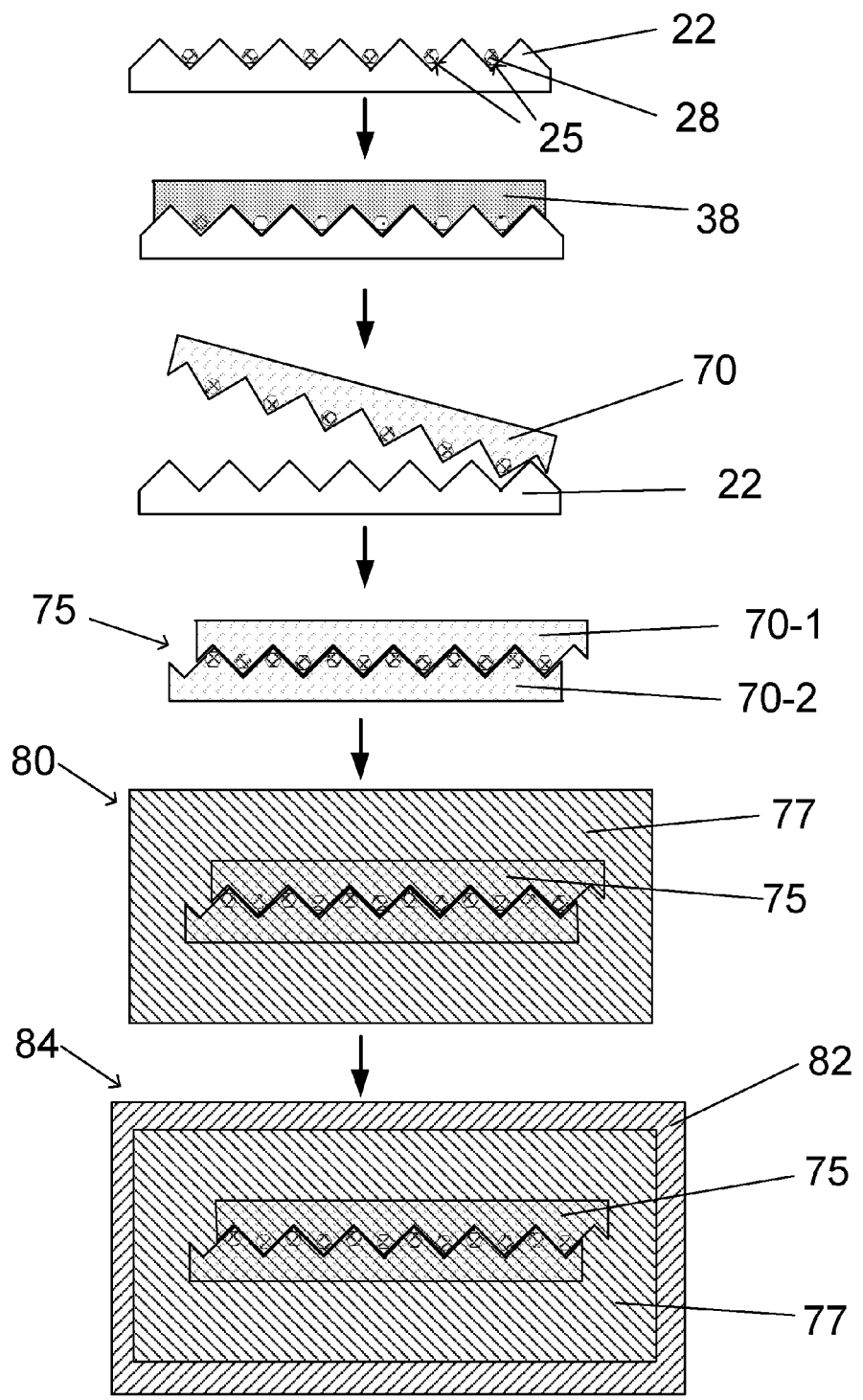
FIG. 10 is a schematic representation of a method for forming a substrate according to an embodiment.

An alternate method of forming a substrate is depicted in FIG. 10. In an embodiment, a material having substantially identical and evenly spaced grooves and corresponding peaks, similar to those of a brightness enhancing film as mentioned earlier, may be used as the base component 22. In an embodiment, the grooves and peaks define a longitudinal dimension, and both the base of the grooves and the peaks define an angle of about 90° in a direction orthogonal to the longitudinal dimension. In a similar manner to that as previously discussed with reference to FIG. 4, the whiskers 28 may be deposited into the grooves 25 of the base component 22, and a material 38 may be deposited over the whiskers to at least partially surround the whiskers and retain the whiskers.

Once the material 38 has at least partially solidified to form a first substrate member 70 with the whiskers 28 retained therein, the first substrate component may be separated from the base component 22. In an embodiment, the base component 22 may be used to form additional ones of the substrate members 70 wherein each substrate member will have a surface conformation which is substantially complementary to the surface conformation of others of the substrate members. Alternatively, several substantially identical base components 22 may be used to substantially simultaneously produce several substrate members 70, or one substrate member may be divide into complementary pieces. Two substrate members 70-1 and 70-2 may then be placed face to face with interleaving peaks and grooves to form a substrate portion 75.

In an embodiment, the material 38 may be a slurry of a ceramic powder, such as alumina or zirconia, or other alternative ceramics. The slurry may be of a composition such as those described earlier with reference to FIGS. 4 and 5. The slurry 38 may be tape casted onto the base component 22 to form a wet green alumina tape, or film 70, with the term 'green' referring to an unfired/unsintered ceramic. Two green alumina tape, or film, members 70-1 and 70-2 may be interlaced and laminated together to form the laminate 75. In an embodiment, the whiskers may be substantially linearly arrayed in the laminate 75. The tape members 70-1 and 70-2 may be laminated together by applying an appropriate pressure that is sufficient to tightly pack the alumina particles together and bind together the layers to form a unified ceramic structure. This pressure may be at least about 10 MPa, and me be about 15 MPa, or alternatively about 20 MPa, or alternatively, about 25 MPa, or alternatively about 30 MPa, or alternatively about 35 MPa, or any pressure value between any two of the listed values, or greater than about 35 MPa.

For large scale production, the tape casting may be done on a tape casting machine having feed and take-up rolls for a strip of base component 22, a slurry dispersing head a drying channel, and a take-up roll for the separated film 70.

In an embodiment, the laminated layers 75 to provide a solidified ingot similar to the substrate ingot 46 of FIG. 4. Alternatively, the laminated layers 75 may be enveloped with additional ceramic powder 77, which in an embodiment may be alumina or zirconia and may be reinforced with additional random silicon carbide whiskers, and the composition may be compressed to form a pellet 80 to form a unified ceramic structure. In an embodiment, the pellet 80 may be sintered to cure the pellet to provide a substrate ingot. In an embodiment having alumina with SiC whiskers as the matrix material, a partial reaction of the alumina and SiC in the SiC whiskers may occur to form a thin (10-30 nm) mullite ($3Al_2O_3$-$2SiO_2$) bonding layer, which may make the composite material mechanically stronger, and provide sufficient temperature stability for further processing, such as cutting, polishing and receiving additional depositions thereon.

Alternatively, the pellet 80 may be further enveloped in an exterior coating 82, which may provide additional corrosion protection from water vapor and alkali salts. The coating 82 may be about 1 mm to about 3 mm thick, and the coating may be mullite, erbium silicate, zircon, or other types of ceramic coatings, and may be applied by dipping or spraying, or any other type of appropriate application method. The final coated pellet may then be sintered to form a substrate ingot 84.

In an embodiment, the pellets may be coated by dipping the pellets into a concentrated mullite suspensions (45 vol %) with a concentration of polyethyleneimine which may be from about 0.1625 mg to about 0.175 mg PEI/$m^2$ mullite surface area. The pellets may be inserted at a rate of about 1.4 mm/s, kept submerged for about 60 s, and withdrawn at a rate of about 1.4 mm/s. The coated pellets may then be dried under ambient conditions, heat treated at about 600° C. to burn out any organics, and sintered at about 1600° C.

Figure 11:
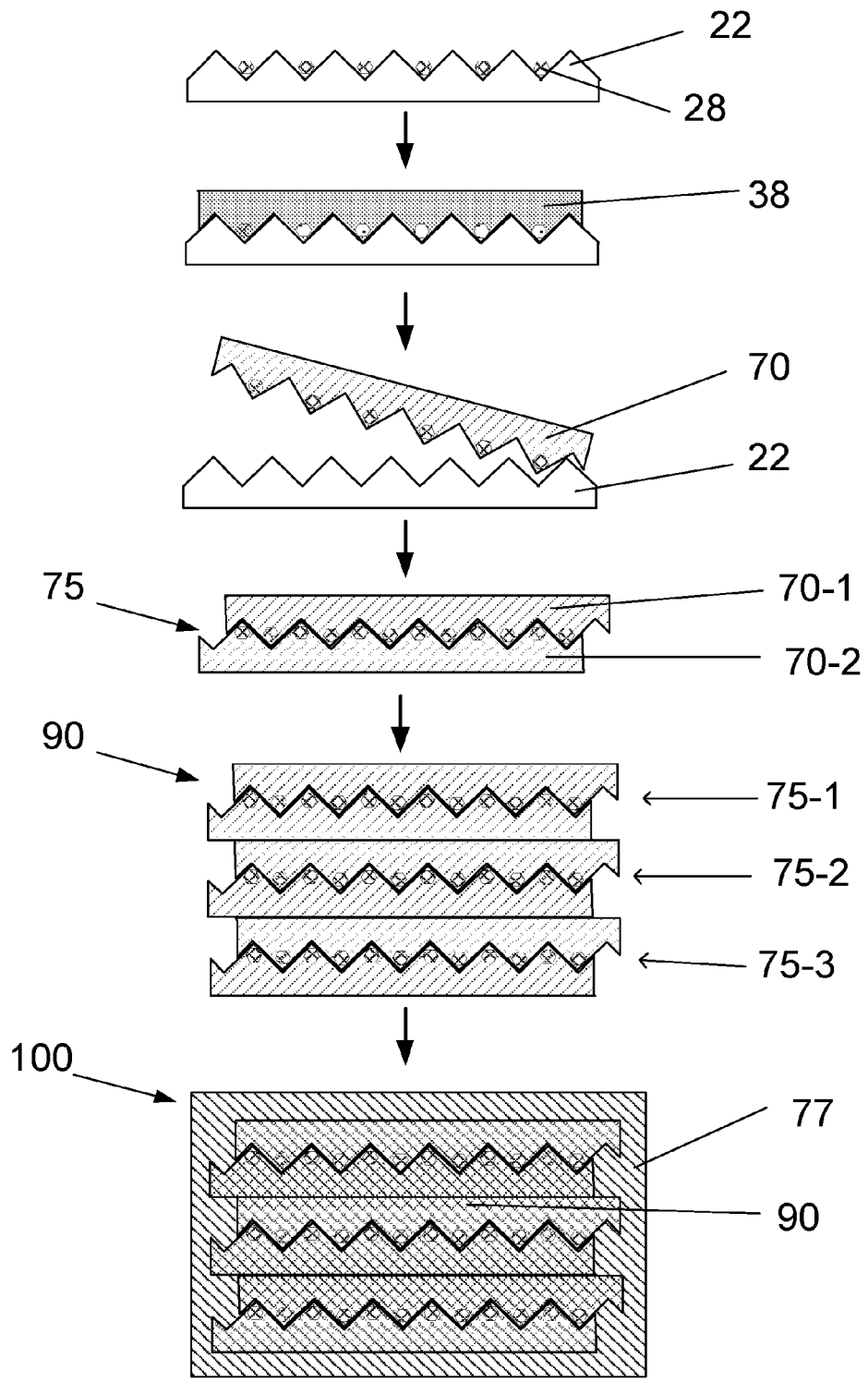
FIG. 11 is a schematic representation of a method for forming a multi-layered substrate according to an embodiment.
Figure 12:
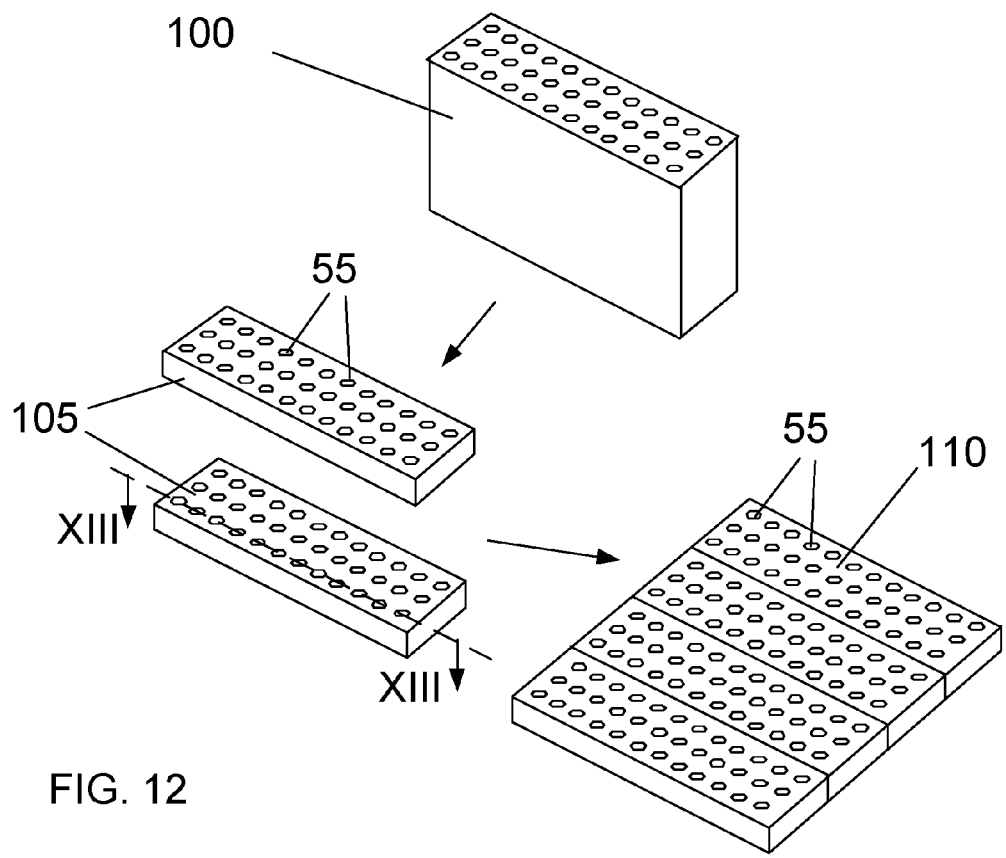
FIG. 12 is a representative illustration of a substrate ingot made in accordance with the method depicted in FIG. 11 according to an embodiment.

In a further embodiment, as depicted in FIG. 11, several laminated layers 75-1, 75-2 and 75-3 may be stacked together to provide a composite 90 having a multi-row array of whiskers 28. In various embodiments, the layers 75-1, 75-2 and 75-3 may be pressed together and/or encased in additional ceramic 77 and/or provided with a protective exterior coating 82 as discussed with reference to FIG. 10. As discussed with the previous embodiment of FIG. 10, the ceramic particles may be fused by sintering to form a final substrate ingot 100, which may be in the shape of a rod, pellet or possibly a block as depicted in FIG. 12.

Figure 13:
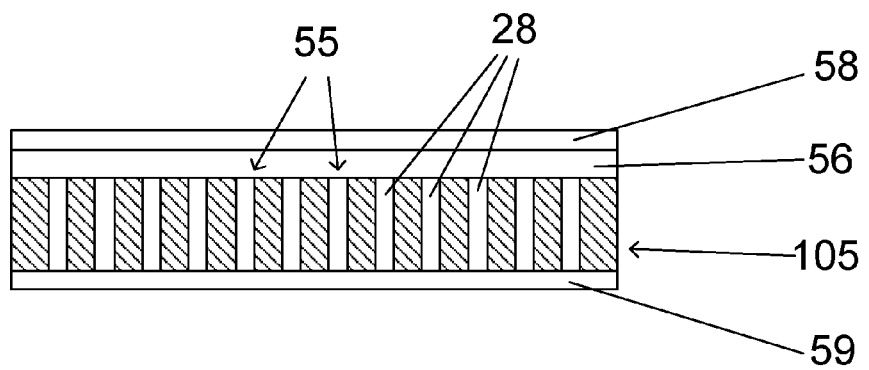
FIG. 13 is a representative illustration of an LED array formed on a substrate layer from the ingot of FIG. 11 according to an embodiment.

The substrate ingot 100 (or alternatively, any of the other substrate ingots 75, 80 or 84 from FIG. 10) may be sliced into thin substrate layers, or sheets 105. At least one surface of the sheets 105 may be polished if necessary dependent on the desired subsequent use. The sheets 105 may be used, either singly, or joined with others of the layers (105-1-105-4) to form a larger substrate sheet 110, as a substrate material for microelectronic applications. A cross-section of a layer 105 taken along the line XIII-XIII in FIG. 12 is depicted in the layer 105 as shown in FIG. 13. The layers 105 may be used for producing LEDs in a similar manner to the layer 52 in FIG. 8. In various embodiments, the discussion relating to the formation of LEDs relating to the layer 52, FIG. 8 and FIG. 9 are also applicable to the formation of LEDs with the layers 105.

FIG. 13 depicts a cross-section of an exemplary LED array using a substrate layer 105. LED layers 56, which may be GaN based layers, may be epitaxially grown on exposed faces 55 of the whiskers 28, and upper and lower electrical contact layers 58 and 59 respectively, may be applied as needed.

EXAMPLE 1

A Substrate of Silica Carbide Whiskers in Alumina

The following example is given with references to FIGS. 4 and 10. About 3 mg of silica carbide (SiC) whiskers 28 was mixed with about 10 ml water to form a whisker dispersion 30, and 3 drops of the whiskers dispersion was applied to the surface of a 3M brightness enhancing film 22. The film was left alone to allow the water to evaporate and enable the whiskers to settle into and align in the grooves of the film. The water essentially completely evaporated in about 2 hours.

An alumina slurry 38 was prepared according to the following table:

|  | Percentage |
| --- | --- |
| Aluminum Oxide | 50-70% |
| Fish Oil | 1-2% |
| Xylene | 15-20% |
| Denatured Ethanol | 15-20% |
| Poly (Vinyl Butyral), B-98-Binder | 2-3% |
| Butylbenzyl phthalate, S-160-Plasticizer | 1-2% |
| Poly (alkylene glycol)-Plasticizer | 1-2% |
| Total weight | 100.00% |

The slurry was tape cast directly onto the dry film to form a wet green alumina tape 70. The alumina slurry was dried at ambient conditions for about 24 hour to harden the alumina around the whiskers, and the tape 70 was peeled from the film 22.

Two sections of the tape 70-1, 70-2 were removed and a first section was inverted and placed over the second section to intermesh the peaks. The layers were placed in a press and compressed with a force of about 34 MPa to laminate the layers 75. The laminated tape was placed in a 13 mm (½ inch) diameter mold with a mixture of alumina powder and silicon carbide whiskers distributed around the tape. The composite was again placed in the press and compressed together with a force of about 34 MPa to form a pellet 80. The resultant pellet was sintered at about 1600° C. in ambient air for about 2 hours.

Slices having a thickness of about 50 µm were taken from the pellet in a plane normal to the longitudinal axis of the whiskers to provide thin substrate layers having an aligned array of whiskers extending between the top and bottom surfaces (layer 52 in FIG. 8).

EXAMPLE 2

A Light Emitting Diode Array on a Whisker Substrate

An LED array will be constructed using the thin substrate layers produced by the method of Example 1. The substrate layer will be placed into an epitaxial growth apparatus on an SiC-coated graphite jig, and the temperature of the substrate will be elevated to 1,100° C. under hydrogen flow in the growth apparatus to remove any oxidation. The substrate temperature will be lowered to 600° C., and TMG-entraining hydrogen gas (20 sccm), which had been obtained through bubbling hydrogen gas into trimethyl gallium (TMG-Group III element source), and $NH_3$ (nitrogen source) (4 slm) will be fed into the growth apparatus for 10 minutes. Thereafter, feeding of the Group III element source will be stopped, and the substrate temperature will be elevated to 900° C., followed by thermal treatment for five minutes, to thereby form a GaN buffer layer. As used herein, the term "sccm" refers to $cm^3$/min and the term "slm" refers to 1/min, wherein each volume is converted to a volume normal state.

Subsequently, the substrate temperature will be elevated to 1,100° C., and TMG-entraining hydrogen gas (20 sccm), which had been obtained through bubbling hydrogen gas into TMG (Group III element source), and $NH_3$ (nitrogen source) (4 slm) will be fed into the growth apparatus, to thereby grow a GaN single-crystal layer (thickness: 4 µm), yielding the Group III nitride semiconductor layer.

To produce an LED emitting a wavelength of about 460 nm, after growth of the GaN single-crystal, an n-type layer formed of a silicon-doped GaN layer (carrier concentration: $1\times10^{19}/cm^3$) will be laminated by use of $SiH_4$ serving as a dopant. Thereafter, the substrate temperature will be lowered to 750° C., and an MQW light-emitting layer formed of five layer units, each including an $In_{0.16}Ga_{0.84}N$ layer (thickness: 3 nm) and a GaN layer (thickness: 7 nm), will be sequentially laminated. Subsequently, the substrate temperature will be elevated again, and a p-type layer (thickness: 100 nm) formed of a magnesium-doped GaN layer will be laminated. An electrical contact layer of Mg/Ag (thickness 10 nm) will then be deposited on the bottom surface of the substrate, and a top translucent electrode layer of NiO/Au (thickness 7 nm) will be deposited on the top LED layer.

This disclosure is not limited to the particular systems, devices and methods described, as these may vary. The terminology used in the description is for the purpose of describing the particular versions or embodiments only, and is not intended to limit the scope.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

What is claimed is:

1. A method to produce an array of semiconductor diodes, the method comprising:
   forming a substrate for the diodes, the forming comprising:
   longitudinally aligning electrically conductive whiskers within substantially parallel grooves in a grooved surface to form substantially parallel whisker components spaced apart from one another across the surface with each whisker component comprising at least one whisker;
   pouring a liquid electrically insulative matrix material onto the grooved surface and over the aligned whiskers to cover a portion of the surface and at least partially surround the whiskers, and allowing the matrix material to solidify to retain the whiskers in the matrix material and form a matrix of the plurality of spaced apart and substantially parallel electrically conductive whisker components, with the whisker components extending longitudinally between a first end surface of the matrix and an opposing second end surface of the matrix and having a first end face exposed in the first end surface and a second end face exposed in the second end surface; and polishing at least the first end surface of the matrix to provide polished first end faces of the whisker components for crystal growth thereon;

growing at least one layer of a semiconductor on the first end surface epitaxial with the exposed first end faces of the whisker components;

depositing a first electrical contact layer on the at least one layer of the semiconductor to provide a first electrical contact with the at least one layer of the semiconductor;

depositing a second electrical contact layer on the second surface of the matrix in contact with the second end faces of the whisker components to provide a second electrical contact with the at least one layer of the semiconductor via the substantially parallel whisker components; and forming a laminated unit with ceramic material as encasement of said laminated unit, wherein forming the laminated unit and said encasement includes:
encasing the laminated unit with ceramic material to form a substantially rod-shaped component with the whiskers disposed longitudinally in the substantially rod-shaped component;
applying pressure to the substantially rod-shaped component to form a unified ceramic structure;
sintering the ceramic structure to form a substantially rod-shaped ceramic substrate having a substantially linear array of whisker components; and
cutting the rod-shaped ceramic substrate into lengths sufficient to provide substrates for the semiconductor diodes.

2. The method of claim 1, wherein:
longitudinally aligning the electrically conductive whiskers includes longitudinally aligning electrically conductive whisker components that comprise at least one of silicon and silicon carbide;
the matrix material comprises ceramic; and
allowing the matrix material to solidify comprises allowing the ceramic to solidify.

3. The method of claim 1, wherein growing the at least one layer of the semiconductor includes growing a semiconductor that comprises a III-nitride semiconductor.

4. The method of claim 1, wherein growing the at least one layer of the semiconductor includes growing a semiconductor that comprises at least one of GaN, AlGaN, AlN, GaInN, AlGaInN, InN, GaInAsN, and GaInPN.

5. The method of claim 2, wherein:
the electrically conductive whiskers comprise silicon carbide whiskers;
longitudinally aligning the electrically conductive whiskers comprises:
forming a liquid suspension of the silicon carbide whiskers;
placing the liquid suspension of the whiskers on the grooved surface;
allowing the whiskers to settle into and align themselves in the grooves; and
drying liquid from the surface to form substantially parallel silicon carbide whisker components interspersed along the surface; and
pouring the electrically insulative matrix material onto the surface and over the settled whiskers comprises:
pouring a slurry of the ceramic onto the surface and over the substantially parallel silicon carbide whisker components; and
allowing the slurry to dry to retain the whiskers in the ceramic formed from the dried slurry.

6. The method of claim 5, wherein the method further comprises at least one of:
forming parallel grooves at about 20 grooves/mm to about 200 grooves/mm in a surface to provide the grooved surface; and
obtaining a material having parallel grooves etched in the surface at about 40 grooves/mm to about 200 grooves/mm to provide the grooved surface.

7. The method of claim 5, wherein the grooves have a base and corresponding intervening peaks between the grooves, the grooves and peaks defining a longitudinal dimension, and both the base of the grooves and the peaks define an angle of about 90° in a direction orthogonal to the longitudinal dimension.

8. The method of claim 5, wherein the slurry of the ceramic fills in the grooves and forms peaks corresponding to the grooves, and the method further comprises:
after allowing the slurry to dry, removing the ceramic from the grooved surface to form a first ceramic film with the whiskers retained therein;
forming a second ceramic film in the same manner as the first ceramic film with other whiskers retained therein;
placing the first ceramic film and second ceramic film in contact with one another with peaks of the first film being disposed substantially between peaks of the second film; and
applying pressure to the first ceramic film and second ceramic film to laminate the films together to form the laminated unit with the whisker components in a substantially linear array.

9. The method of claim 8, further comprising:
forming additional ones of the laminated unit;
stacking a plurality of the laminated units together in longitudinal alignment with one another to form rows of substantially linearly arrayed whisker components;
encasing the stacked laminated units in additional ceramic material to form a substantially rod-shaped component with the whiskers disposed longitudinally in the substantially rod-shaped component;
applying pressure to the substantially rod-shaped component to form a unified ceramic structure having rows of substantially linearly arrayed whisker components;
sintering the ceramic structure to form a substantially rod-shaped ceramic substrate;
cutting the rod-shaped ceramic substrate into sheets of substrate for the diodes; and
wherein growing the at least one layer of the semiconductor on the first end surface comprises growing at least one layer of a III-nitride semiconductor on the substrate.

10. The method of claim 1, wherein growing the at least one layer of the semiconductor comprises growing layers of III-nitride layers, n-doped III-nitride layers, p-doped III-nitride layers, quantum well layers, light emitting layers, cladding layers and combinations thereof sufficient to provide LEDs.

11. The method of claim 1, wherein:
depositing of the first electrical contact layer comprises depositing at least one of:
a layer of at least one metal on the semiconductor layer;
a layer of at least one conductive polymer on the semiconductor layer; and
a layer of at least one of organically modified ceramic and polyaniline on the semiconductor layer; and depositing of the second electrical contact layer comprises depositing at least one of:
- a layer of at least one metal on the second end surface of the matrix;
- a layer of at least one conductive polymer on the second end surface of the matrix; and
- a layer of at least one of organically modified ceramic and polyaniline on the second end surface of the matrix.

12. A method to produce an array of semiconductor diodes, the method comprising:
forming a substrate for the diodes, wherein forming comprises:
longitudinally aligning a plurality of whiskers, each of said whiskers including silicon or silicon carbide, in substantially parallel grooves of a grooved surface to form substantially parallel whisker components with each whisker component comprising at least one whisker, wherein longitudinally aligning includes:
- forming a liquid suspension of the at least one of silicon whiskers and silicon carbide whiskers;
- placing the liquid suspension of the whiskers on the grooved surface; and
- allowing the whiskers to settle into and align themselves in the grooves;

providing an electrically insulative material over the settled whiskers to at least partially surround the settled whiskers, and allowing the electrically insulating material to solidify to retain the whiskers in the material and form a substrate comprising the plurality of spaced apart and substantially parallel whisker components, with the whisker components extending longitudinally between a first end surface of the substrate and an opposing second end surface of the substrate and having a first end face exposed in the first surface and a second end face exposed in the second surface; and forming an array of semiconductor diodes on the substrate, with each diode comprising at least one of the parallel whisker components, wherein forming the array includes:
- providing a semiconductor material layer on the first surface of the substrate and in contact with the exposed first end faces of the whisker components;
- providing a first electrical contact layer on the semiconductor material layer to provide a first electrical contact with the semiconductor material; and
- providing a second electrical contact layer on the second surface of the substrate in contact with the second end faces of the whisker components to provide a second electrical contact with the semiconductor material via the substantially parallel whisker components.

13. The method of claim 12, wherein providing the electrically insulative material comprises providing at least one of a polymer and a ceramic.

14. The method of claim 13, wherein providing the semiconductor material comprises providing a III-nitride semiconductor and wherein providing the semiconductor material layer on the first surface of the substrate comprises growing semiconductor crystals on the first surface epitaxial with the exposed first end faces of the whisker components.

15. The method of claim 14, wherein growing the semiconductor crystals comprises growing at least one of GaN, AlGaN, AlN, GaInN, AlGaInN, InN, GaInAsN, and GaInPN crystals.

* * * * *